United States Patent
Utter et al.

(10) Patent No.: US 9,092,371 B2
(45) Date of Patent: Jul. 28, 2015

(54) SIGNAL PARAMETER ESTIMATOR

(75) Inventors: Alexander C. Utter, Los Angeles, CA (US); Eugene Grayver, Manhattan Beach, CA (US)

(73) Assignee: The Aerospace Corporation, El Segunda, CA (US)

( * ) Notice: Subject to any disclaimer, the term of this patent is extended or adjusted under 35 U.S.C. 154(b) by 455 days.

(21) Appl. No.: 12/875,010

(22) Filed: Sep. 2, 2010

(65) Prior Publication Data

US 2012/0059613 A1 Mar. 8, 2012

(51) Int. Cl.
| | |
|---|---|
| *G01R 13/00* | (2006.01) |
| *G06F 17/14* | (2006.01) |
| *G01R 23/16* | (2006.01) |
| *H04L 27/00* | (2006.01) |

(52) U.S. Cl.
CPC .............. *G06F 17/141* (2013.01); *G01R 23/16* (2013.01); *H04L 27/0006* (2013.01)

(58) Field of Classification Search
CPC ........... H04B 10/0795; H04B 10/0793; H04B 1/109; H04B 1/1027; H04L 27/2647; H04L 27/2697; H04L 1/04; H04L 27/0006; G06F 17/141; G01R 23/16

USPC .......... 702/68, 70, 190, 32, 66, 189; 398/202, 398/209, 25; 348/732

See application file for complete search history.

(56) References Cited

U.S. PATENT DOCUMENTS

| | | | |
|---|---|---|---|
| 6,690,746 B1 * | 2/2004 | Sills et al. ..................... 375/316 |
| 7,158,588 B2 | 1/2007 | Norris et al. | |
| 7,340,375 B1 | 3/2008 | Petenaud et al. | |
| 7,623,790 B2 * | 11/2009 | Marom .......................... 398/94 |
| 7,920,990 B2 * | 4/2011 | Nicholls et al. ............... 702/190 |
| 8,154,666 B2 * | 4/2012 | Mody ........................... 348/732 |
| 2007/0071441 A1 * | 3/2007 | Marom .......................... 398/25 |
| 2010/0305873 A1 * | 12/2010 | Sjoden et al. .................. 702/30 |

OTHER PUBLICATIONS

Adolfo Recio, Blind signal parameter estimation for the Rapid Radio framework, Oct. 2009, IEEE.*
Jorge A. Suris Pietri, Rapid Radio: Analysis-Based Receiver Deployment, Aug. 2009, Virginia Polytechnic Institute.*

* cited by examiner

*Primary Examiner* — Sujoy Kundu
*Assistant Examiner* — Harun Chowdhury
(74) *Attorney, Agent, or Firm* — Paul D. Chancellor

(57) ABSTRACT

A signal parameter estimator includes curve fitting of multiple ideal spectral shapes.

16 Claims, 8 Drawing Sheets

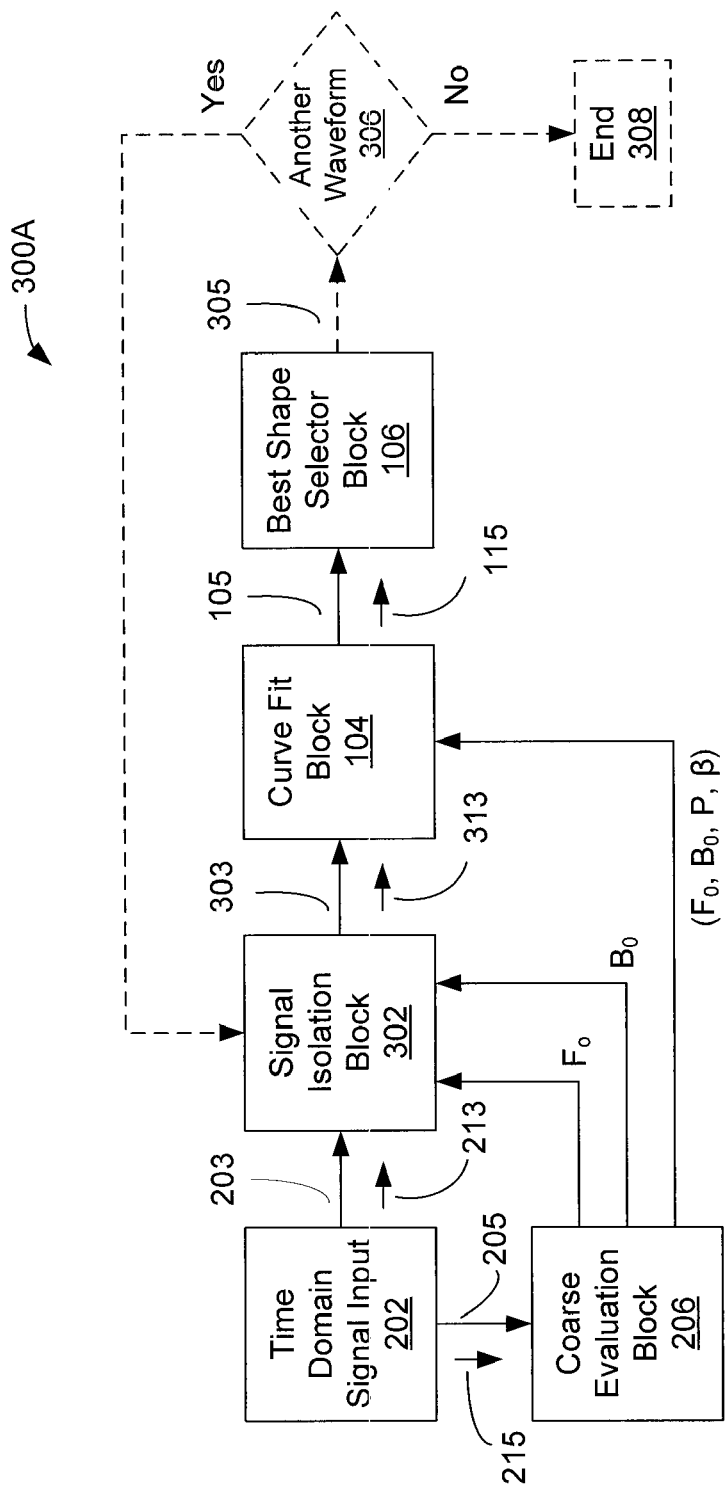

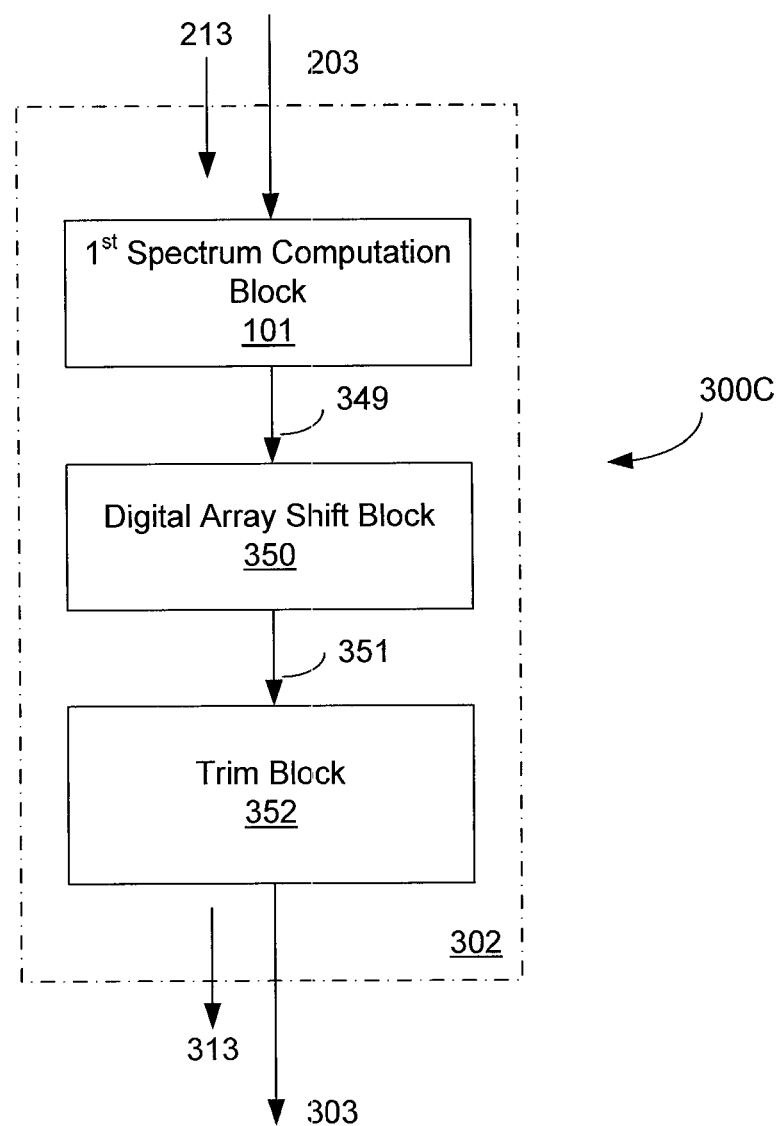

SIGNAL PARAMETER ESTIMATOR

INCORPORATION BY REFERENCE

U.S. Pat. Nos. 6,690,746, 7,158,588, and 7,340,375 are incorporated herein by reference in their entirety and for all purposes, including in particular their disclosure of signal parameter estimation techniques (U.S. Pat. Nos. 6,690,746 and 7,158,588) and signal noise floor estimation techniques (U.S. Pat. No. 7,340,375).

BACKGROUND OF THE INVENTION

1. Field of the Invention

The invention relates to systems and methods for estimating sets of signal parameters used in respective waveform equations to model signal data and for choosing the equation that best models the signal data.

2. Discussion of the Related Art

In most wireless communications systems, parameters such as bandwidth and pulse shape are fixed during design. These parameters then drive the design of the radio hardware that transmits or receives the selected signal format.

However, in some applications these parameters are not known a priori. One example is cognitive radio, an emerging field where reconfigurable radio transceivers detect unused spectrum and intelligently utilize it without interfering with licensed users. Depending on local conditions, a cognitive radio might select any unused carrier frequency, and might also dynamically adapt signal bandwidth to fill available spectrum. Establishing initial contact requires a search of all signals that occupy a previously established frequency range, followed by a more detailed investigation of each.

Another example is reconnaissance and electronic warfare, especially the interception of signals from an unknown origin. In these applications, it is useful to quickly estimate basic signal parameters for a plurality of signals of unknown origin. In general, estimates of these parameters should be accurate enough to match the signal with a receiver's limited timing and frequency tracking loop capability.

While some previous signal parameter estimation techniques exist (see U.S. Pat. Nos. 6,690,746 and 7,158,588), they are generally limited to specific modulation types. The well-known symbol-rate spectral line estimator, for instance, functions only for digital modulations with specific pulse shapes. Other methods apply only to specific digital modulation formats (e.g. phase-shift keying but not quadrature-amplitude modulation).

SUMMARY OF THE INVENTION

The invention utilizes input data to estimate signal parameters for plural shape equations and selects the shape equation best fitting the sample data. In an embodiment, signal identification is performed entirely in the frequency domain. This is in contrast to time-domain techniques of the prior art.

In an embodiment, the current invention calculates precise estimates of the carrier frequency, bandwidth, and pulse shape by a method of iterative curve fitting on the measured power spectral density of a frequency band of interest. In an embodiment, the first step is to obtain rough initial estimates of the parameters of interest: each signal's carrier frequency, bandwidth, and power, as well as the noise power. These can be obtained by manual inspection of a spectrum or by automated techniques such as pattern matching. Iterative curve-fitting occurs next. The spectral shape resulting from a signal is a well-known function of its center frequency, bandwidth, and pulse-shape. Therefore, the estimated values of these parameters can be used to re-create an estimated spectrum. The accuracy of this estimate can be calculated using sum of the square-error or a similar criterion. This quantity allows the use of generic multivariable optimization algorithms, such as simple gradient descent, the Levenberg-Marquardt algorithm, exhaustive search, or some combination of several algorithms to optimize robustness and final fit precision. The curve-fitting/optimization process can be performed for a single signal at a time or for all signals simultaneously. If desired, the initial estimates for each signal can be used to reconfigure a receiver's frequency and bandwidth, to allow a new, more detailed estimate of the spectrum in the region near each signal. The pulse shape can be determined by fitting a variety of preselected pulse-shape functions (including necessary parameters such as the roll-off factor for root-raised-cosine pulse shaping) and selecting the curve with the best final fit.

BRIEF DESCRIPTION OF THE DRAWINGS

The present invention is described with reference to the accompanying figures. These figures, incorporated herein and forming part of the specification, illustrate the present invention and, together with the description, further serve to explain the principles of the invention and to enable a person skilled in the relevant art to make and use the invention.

FIG. 3A is a second embodiment of the signal parameter estimator in accordance with FIG. 1.

FIG. 3C is a second embodiment of the signal isolator block of FIG. 3A.

DETAILED DESCRIPTION OF THE PREFERRED EMBODIMENTS

The disclosure provided in the following pages describes examples of some embodiments of the invention. The designs, figures, and descriptions are non-limiting examples of certain embodiments of the invention. For example, other embodiments of the disclosed device may or may not include the features described herein. Moreover, disclosed advantages and benefits may apply to only certain embodiments of the invention and should not be used to limit the disclosed inventions.

Figure 1:
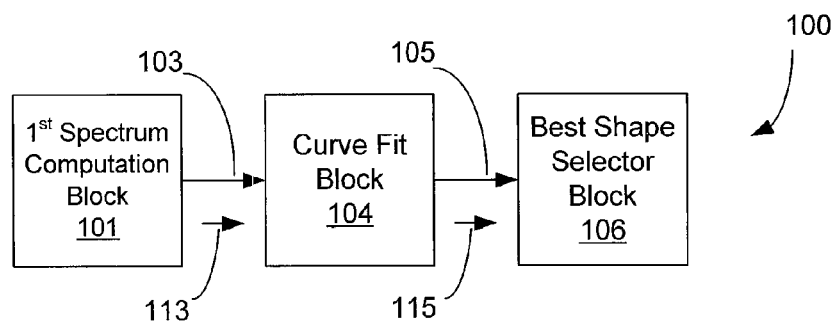
FIG. 1 is a signal parameter estimator in accordance with the present invention.

FIG. 1 shows a signal parameter estimator 100. A curve fit block 104 is coupled to a first spectrum computation block 101 and a best shape selector block 106 via a curve fit block input connection 103 and a curve fit block output connection 105. As used herein, each of the words connect, couple, and similar words encompass linkages that are direct (no interposed parts) and linkages that are indirect (with interposed parts).

Any suitable spectrum computation known to skilled artisans may be used to compute the spectrum 101. Suitable methods of obtaining the spectrum include use of a spectrum analyzer and the averaged output from a direct FFT of a digitally sampled signal. An exemplary generic spectrum computation includes 1) down-convert the signal to an intermediate frequency if it is at a higher frequency, 2) digitize the signal if not already digitized, and 3) performing power spectrum estimation. The power spectrum estimation can use any of the well established techniques such as Welch, Yule-Walker, periodogram, simple averaged FFT, and the like. In an embodiment, the spectrum computation block output includes an array of digital samples corresponding to the signal power at a range of frequencies.

The curve fit block 104 receives frequency domain signal information 113 from the spectrum computation block 101. The curve fit block assumes signals embedded in the input spectrum match one or more known ideal signal shape equations ($P_1(x)$, $P_2(x)$ ... ).

Signal parameters for use in each signal shape equation are estimated in the curve fit block 104. In an embodiment, the signal parameters are constants. And, in an embodiment, these constants include one or more of bandwidth ($B_0$), center frequency ($F_c$), power (P) and, in some cases, roll-off factor (β for raised-cosine and root-raised cosine shapes).

As persons of ordinary skill in the art will understand, the curve fit algorithm determines values of shape equation constants, here the signal parameters, that tend to minimize differences between the sample data (S(x1), S(x2), S(x3) ... ) and the shape equation data P(x). Each of the signal shape equations is therefore adapted to fit the sample data.

However, each equation presumes a certain signal shape (e.g., sinc, raised cosine, root raised cosine, Gaussian, MSK FM) and a particular one of these signal shapes will typically fit the sample data better than the others. Therefore, identifying the signal shape equation that best fits the sample data is tantamount to identifying a signal shape that is inherent in the sample data.

Goodness of fit information indicates how well each signal shape equation fits the sample data. This goodness of fit information is evaluated in the select best fit block 115 where the best fitting signal shape is identified by selecting a signal shape equation and the corresponding signal parameters.

In an embodiment, a coarse evaluation block identifies signal candidates and initial estimates of one or more signal parameters for each candidate.

Figure 2A:
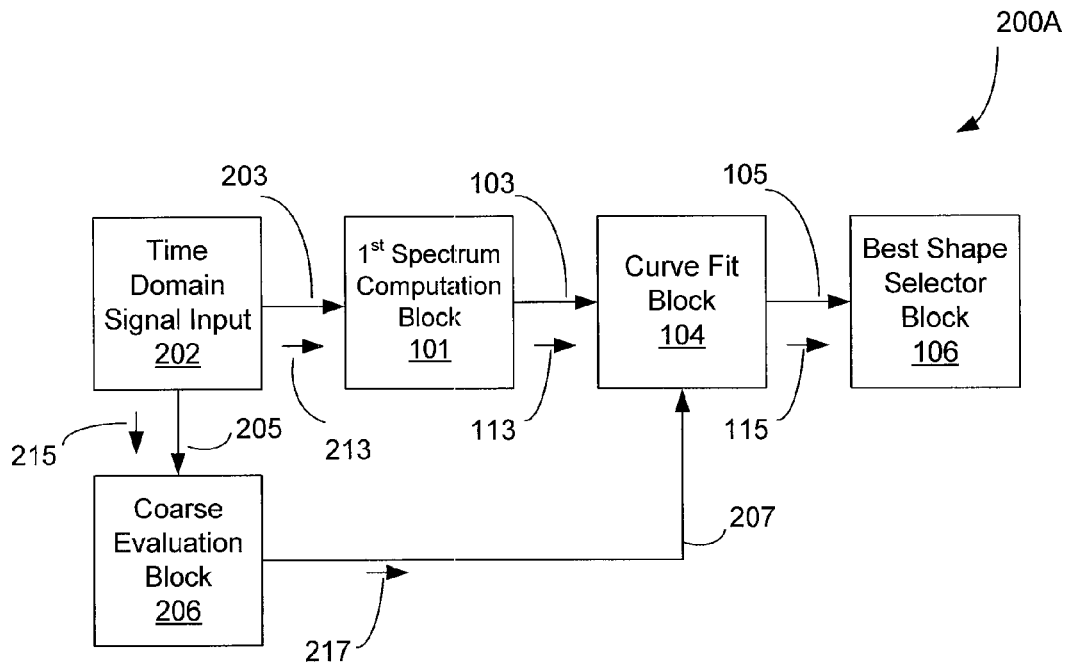
FIG. 2A is a first embodiment of the signal parameter estimator of FIG. 1.

FIG. 2A shows the signal parameter estimator of FIG. 1 further including a coarse evaluation block and a time domain signal input 200A. The coarse evaluation block 206 is coupled with the time domain signal input 202 and the curve fit block 104 via a coarse evaluation input connection 205 and a coarse evaluation output connection 207. Time domain signals 213, 215 are passed to the first spectrum computation block 101 and the coarse evaluation block via respective signal spectrum block input 203 and coarse evaluation block input 205 connections.

In the course evaluation block 206, one or more signal candidates are identified. For each candidate, one or more signal parameters are estimated. These parameters or values derived from them are passed 217 to the curve fit block 104. As explained below, some embodiments of the invention utilize the signal parameter estimates during signal isolation and curve fitting.

Figure 2B:
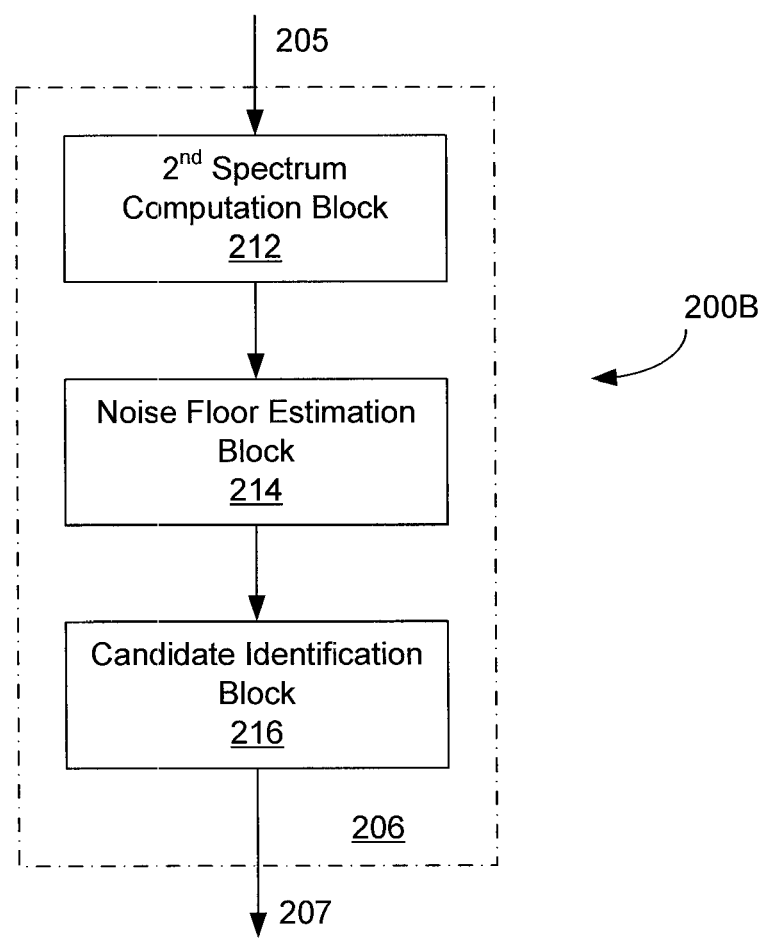
FIG. 2B is an embodiment of the coarse evaluation block of FIG. 2A.

FIG. 2B shows a multi-part coarse evaluation block 200B. The coarse evaluation block 206 includes a second spectrum computation block for converting the time domain signal into a frequency domain signal 212, a noise floor estimation block for distinguishing signal content from noise 214, and a candidate identification block for selecting waveform(s) to be processed 216.

As explained above, any suitable spectrum computation known to skilled artisans may be used to compute the spectrum 212. In an embodiment, the spectrum computation block output is an array of digital samples corresponding to the signal power at a range of frequencies.

Noise floor estimation 214 and identification of signal candidates 216 is, in some embodiments, a manual process. Here, a skilled artisan examines the spectrum, estimates the noise floor, identifies a signal candidate, and estimates related signal parameters.

In an embodiment, a course signal identification algorithm assigns signal samples to frequency bins and compares the power in each frequency bin against the estimated noise floor. Bins with power exceeding a threshold value (for example, just above the noise floor) are identified as candidates for further investigation. Adjacent bins belonging to the same signal are grouped and artifacts of certain pulse-shapes, such as side lobes, are rejected.

Other noise floor estimation methods include those discussed by Ready, M. J. Downey, M. L. Corbalis, L. J. "Automatic Noise Floor Spectrum Estimation in the Presence of Signals." *Asilomar Conference on Signals Systems and Computers.* 1997, Vol. 1, pp. 877-881 and Sundarrajan Rangachari, Philipos C. Loizou. "A noise-estimation algorithm for highly non-stationary environments." *Speech Communication*, Volume 48, Issue 2, February 2006, pp. 220-231.

Other coarse signal identification and estimation methods include manual and automated solutions using one or more of discriminant analysis, principal component analysis, principal curve, factor analysis, independent component analysis, clustering, K-means, Jarvis & Patrick clustering, and feature selection.

FIG. 3A shows an embodiment of the signal parameter estimator of FIG. 2A further including a signal isolation block 300A. The signal isolation block 302 is coupled with each of the time domain signal input 202 and the curve fit block 104 via a respective first signal isolation block input 203 and a signal isolation block output 303.

In the course evaluation block 202, signal parameters for a waveform selected from the spectrum are determined. In this embodiment, the coarse evaluation block has three outputs for transferring this information. First and second coarse evaluation block outputs $F_0$, $B_0$ are coupled to the signal isolation block 302. And, a third coarse evaluation block output ($F_0$, $B_0$, P, β) is coupled to the curve fit block 104.

In the signal isolation block 302, a signal identification algorithm is executed for the candidate found in the course evaluation block 206. A signal of interest corresponding to the candidate is isolated and formatted in preparation for comparison with a known signal shape. An indication of this isolated signal of interest 313 is transferred via the signal isolation block output 303 to the curve fit block 104.

In some embodiments, a plurality of candidate signals are found in the course evaluation block 206 and a respective plurality of signals of interest are isolated in the signal isolation block 302. Multiple signals of interest are processed via the curve fit and best shape selector blocks 104, 106. For example, in an embodiment the best shape selector block is coupled 305 to "another signal" decision block 306. Here, if a candidate remains to be processed, the "Yes" path returns to the signal isolation block where a corresponding signal of interest is isolated and forwarded to the curve fit block for processing. If no candidates remain to be processed, the "No" path ends candidate processing 308.

Figure 3B:
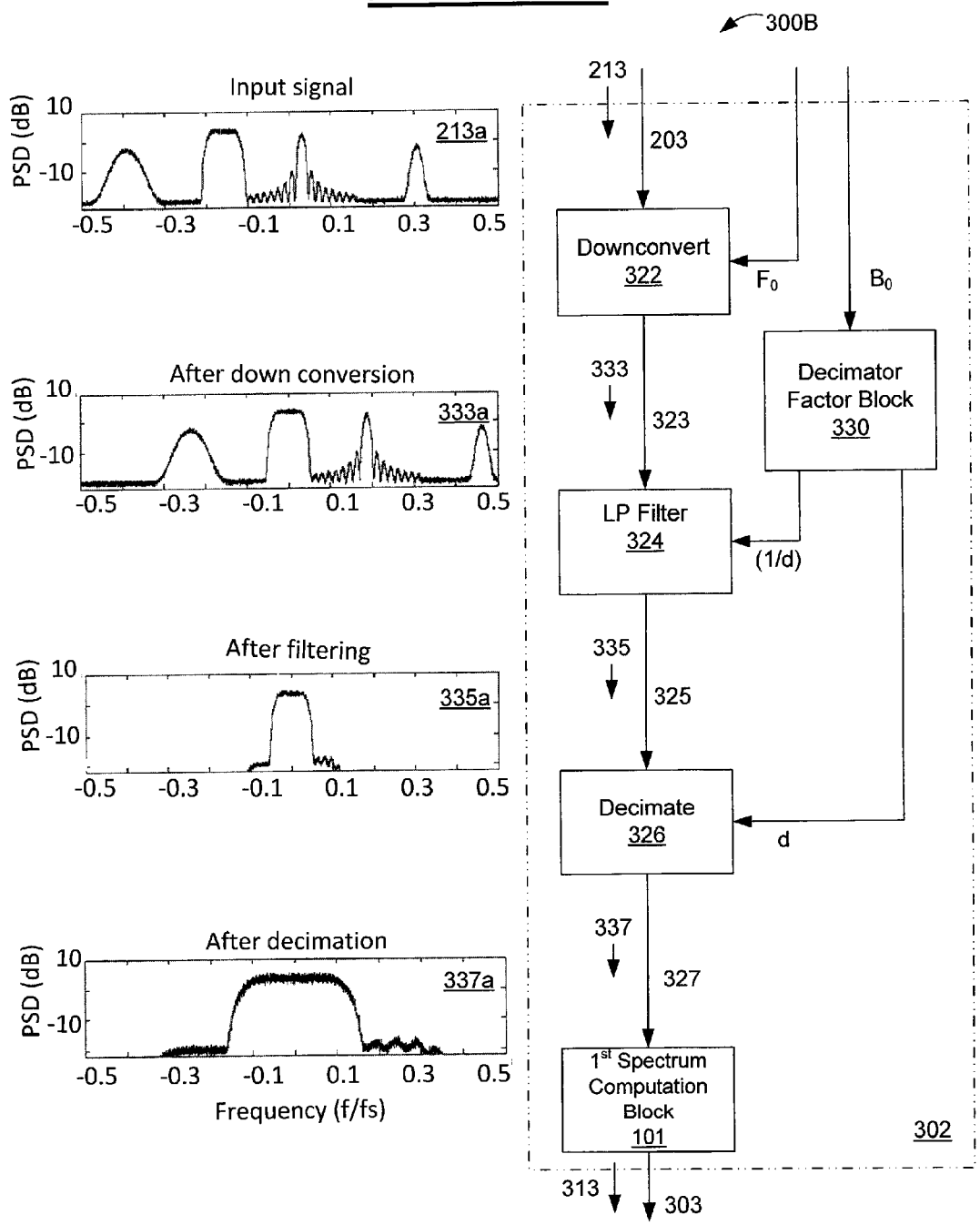
FIG. 3B is a first embodiment of the signal isolator block of FIG. 3A.

FIG. 3B shows an embodiment of a signal isolation block using a time domain downconversion and decimation process 300B. Notably, an analogous process in the frequency domain serves the same purpose.

In the time domain example, the signal isolation block 302 includes a downconverter 322 coupled to an LP (low pass) filter 324 by a downconverter and LP filter coupling 323. The downconverter is also coupled to a center frequency signal $F_0$ such as the center frequency signal of the coarse evaluator block 206. The LP filter is coupled to a decimator 326 by an LP filter and decimator coupling 325. The decimator is coupled to the $1^{st}$ spectrum computation block 101 by a decimator and 1st spectrum computation block coupling 327. And, the LP filter and decimator are coupled to a decimator factor block 330 by its respective outputs 1/d and d.

The structure and operation of this time domain signal isolation block 302 is illustrated when a particular input signal 213a is processed. Note, the signals shown in charts 213a, 333a, 335a, and 337a are frequency domain representations of their time domain equivalents. As shown, input signal 213a includes four waveforms with center frequencies of approximately −0.4, −0.15, 0.03, 0.3. If the signal/waveform centered at −0.15 is selected for processing during coarse evaluation 206, initial estimates of signal parameters are $F_0$=−0.15, $B_0$=0.1, and P=25 (magnitude).

Downconverter inputs include the time domain input signal 213 (graphically depicted in chart 213a), and the center frequency $F_0$ of the selected waveform, here −0.15. In the downcoverter 322, the signal of interest is centered such that $F_0$ is near frequency zero. The downconverted input signal 333 (graphically depicted in chart 333a) is coupled 323 to the LP filter 324.

The LP filter 324 is applied at a cut-off frequency of 1/d where d is the decimation factor determined in the decimation factor block 330 from bandwidth $B_0$ of the selected waveform. The filtered input signal 335 (graphically depicted in chart 335a) is coupled 325 to the decimator 326.

Decimator inputs include the filtered input signal 335 and the decimation factor d. In the decimator, 1 in every d samples is kept. The decimated signal 337 (graphically depicted in chart 337a) is coupled 327 to the 1st spectrum computation block 101. An output of the 1st spectrum computation block 303 provides a frequency domain representation 313 of the decimated time domain signal.

FIG. 3C shows an embodiment of a signal isolation block using a frequency domain process 300C. In the frequency domain example, the signal isolation block 302 includes a 1st spectrum computation block 101 coupled to a digital array shifter block 350 by a computation block and shifter block coupling 349. The digital array shifter block is coupled to a trim block 352 by a shifter and trim block coupling 351. In the digital array shifter block, the input spectrum, in the form of a digital array, is shifted to center $F_0$ at 0 Hz. In the trim block, the incoming centered signal is trimmed to discard spectrum samples lying outside the band of interest.

Figure 3D:
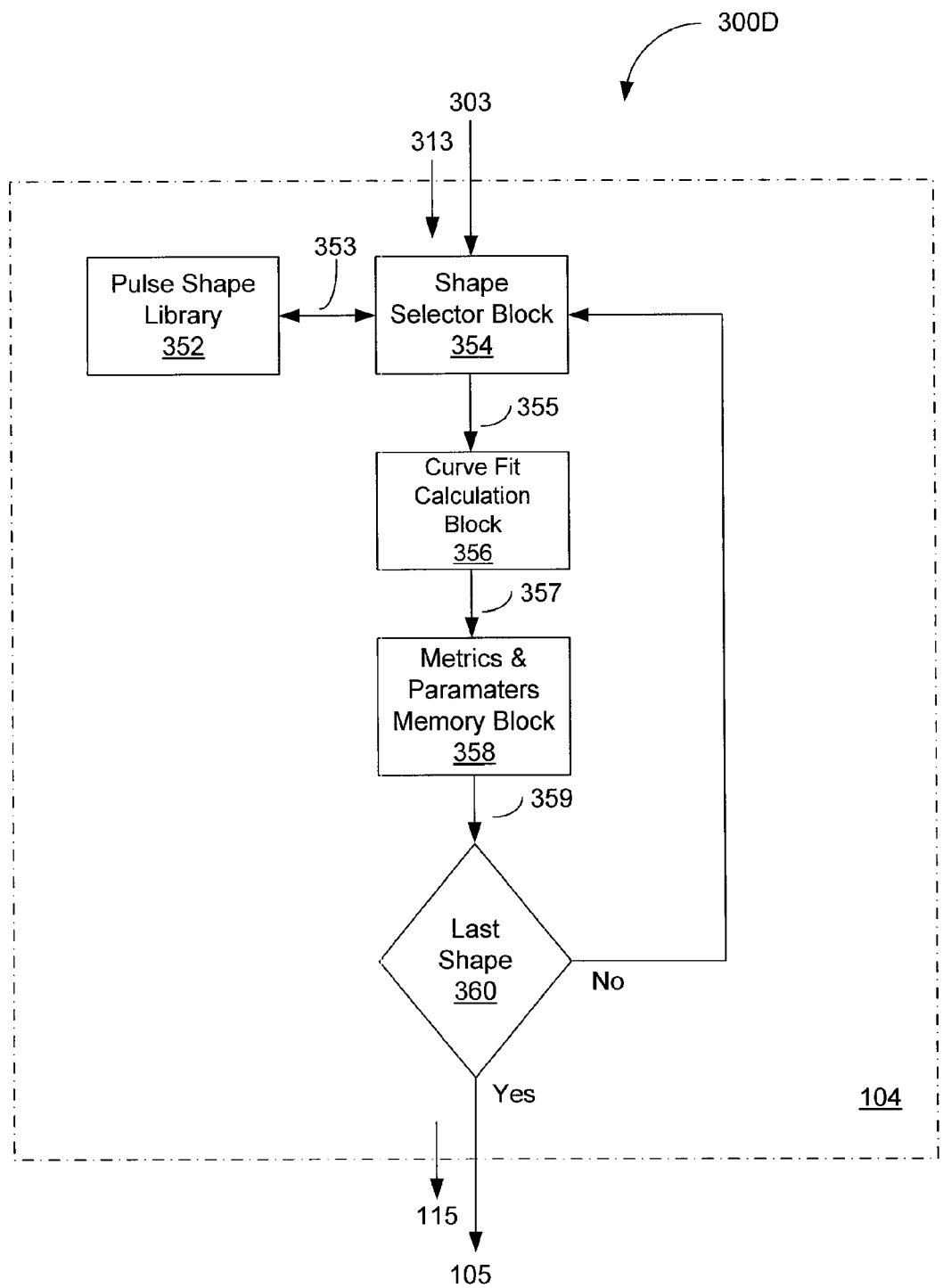
FIG. 3D is an embodiment of the curve fit block of FIG. 1.

FIG. 3D shows an embodiment of a curve fit block 300D. The curve fit block 104 includes a signal shape selector block 354 coupled to a curve fit calculation block 356 by a shape selector and curve fit coupling 355. The curve fit calculation block is coupled to a memory block 358 for storing goodness of fit metrics and signal parameters by a curve fit and memory block coupling 357. The memory block is coupled to a last shape decision block 360 by a last shape and decision block coupling 359.

A pulse shape library 352 is coupled 353 to the shape selector block 354 for exchanging shape related information. As used herein, shape related information is, in various embodiments, an indication of shape such as an equation representing the signal shape or another suitable representation.

The shapes selected for storage in the pulse shape library depend on the signal shapes anticipated to be present in the input signal (e.g., frequency domain input signal) or derived from the input signal (e.g., time domain input signal). Exemplary signal shapes include sinc, raised cosine, root raised cosine, Gaussian, and frequency modulation (FM).

In an embodiment, the signal shapes are represented by the equations shown below. Note that MSK is substituted for FM to provide a well-defined, simple equation. The signal shape equations include parameters $F_0$ (center frequency), $B_0$ (bandwidth), and P (power). The raised-cosine and root-raised cosine shape equations have an additional parameter, $\beta$ (roll-off factor). To simplify each expression, the following reduced frequency parameter is defined:

$$x=(f-F_0)/B_0$$

Equations for each shape in terms of reduced frequency are as follows:

Sinc:

$$PSD_{sinc}(x) = P \cdot \left(\frac{\sin\pi x}{\pi x}\right)^2$$

Raised cosine:

$$PSD_{rc}(x) = \begin{cases} P & \text{if } |x| \leq \frac{1}{2}(1-\beta) \\ 0 & \text{if } |x| > \frac{1}{2}(1+\beta) \\ \frac{1}{2}P \cdot \left[1 + \cos\left(\frac{\pi}{\beta}\left[|f| - \frac{1}{2}(1-\beta)\right]\right)\right] & \text{otherwise} \end{cases}$$

Root raised cosine: $PSD_{rrc}(x)=\sqrt{P \cdot PSD_{rc}(x)}$

Gaussian: $PSD_{gauss}(x)=P\exp(-x^2)$

MSK:

$$PSD_{msk}(x) = P \cdot \left(\frac{\cos 2\pi x}{1 - 16x^2}\right)^2$$

The shape selector 354 selects a shape from the pulse shape library 352 for use by the curve fit calculation block 356. In the curve fit calculation block, signal parameters that yield the curve closest to the data points are determined by a suitable curve fit method. As skilled artisans will understand, this analysis is typically accomplished by defining a function measuring a difference between the sample data and the equation modeling the sample data. The function is typically chosen as the sum of the squares of the vertical deviations from each data point to the curve. The deviations are first squared and then added up to avoid cancellations between positive and negative values. In an embodiment, the solution process begins with an initial guess of the signal parameters and in an iterative process the initial guess is refined to minimize the sum of the squares difference.

When a set of signal parameters corresponding to a minimized sum of the squares difference is determined, the accuracy of the resulting curve fit can be estimated by any suitable method known to skilled artisans. Manual methods include visual comparison of a graph of the sample data and the corresponding data calculated from the modeling equation. Methods lending themselves to automation include calculating $R^2$, a dimensionless fraction between 0.0 and 1.0 that quantifies goodness of fit. $R^2=(1-(SSreg/SStot))$ where SSreg is computed from the sum of the squares of the distances of the points from the best-fit curve determined by nonlinear regression and SStot is the sum of the square of the distances of the points from a horizontal line through the mean of all Y values.

When a goodness of fit metric is determined for a particular shape, indications of the shape, the metric and the corresponding parameters are stored in the memory block 358. The decision block 360 passes control back to the select shape block if more shapes remain to be evaluated. When all of the shapes have been evaluated, the decision block passes control to the select best shape block 106.

Figure 3E:
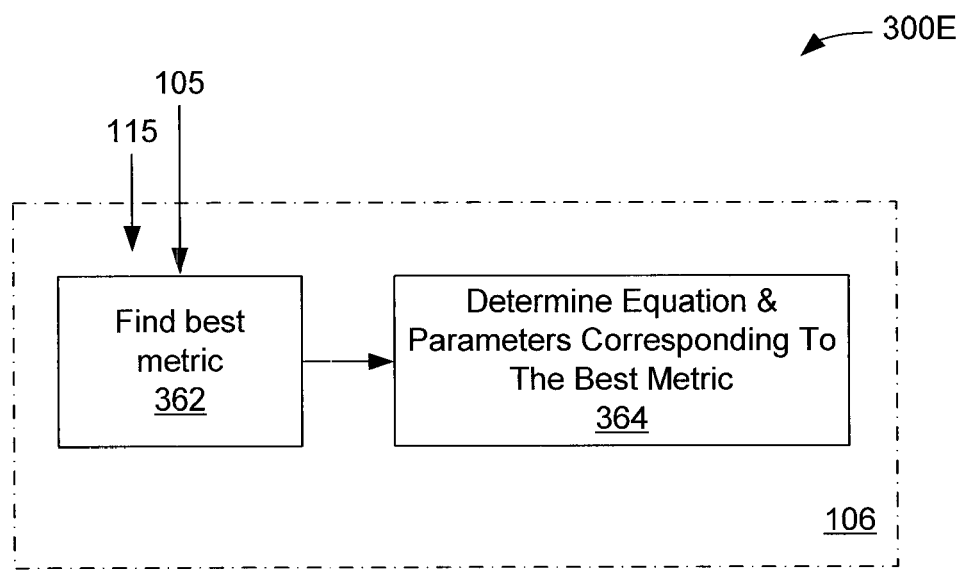
FIG. 3E is an embodiment of the best shape selector block of FIG. 1.

FIG. 3E shows an embodiment of the best shape selector block 300E. In the best shape selector block 106, the metrics stored in the memory are compared 362 to determine the best metric. The equation and parameters corresponding to the best metric are identified as the best fit 364.

During operation, the curve-fitting process can be performed in various ways. As described above, the curve fitting process can be performed by fitting the entire spectrum (FIGS. 1 and 2A) or by isolating particular signals in the spectrum (FIG. 3A). Embodiments with signal isolation include those with signal isolation in the time domain (FIG. 3B) and those with signal isolation in the frequency domain (FIG. 3C).

As is evident from the above, embodiments curve-fitting the entire spectrum (all signals simultaneously) do not require a signal isolation block 302. Rather, as shown in FIGS. 1 and 2A, there is no signal isolation block between the spectrum computation block 101 and the curve fit block 104.

Entire spectrum curve fit embodiments include: a) joint solution embodiments where parameters for multiple signals are evaluated simultaneously and b) sequential solution embodiments with depletion.

In some joint solution embodiments, coarse evaluation of an input spectrum 206 provides the number of candidate signals of interest in the spectrum, for example Signal 1 and Signal 2. If there are three possible shapes for each signal (A, B, C), then nine combinations of the shape equations can be constructed: A+B, A+C, B+C, B+A, C+B, C+A, A+A, B+B, C+C. Fitting each of these combinations to the sample data in curve fit block 104 provides nine competing fits. Notably, each curve fit finds signal parameters for two shape equations (for example, $(F_{01}, B_{01}, P_1$ and $F_{02}, B_{02}, P_2))$. As described above, the best shape selector block 106 compares these fits, here combinations of shape equations rather than single shape equations, to determine the best fit.

In some sequential solution embodiments, each signal is curve fitted in sequence using depletion. Here, candidate signals are identified at the outset or seriatum. The identified signal is fitted and the resulting fit is subtracted from the overall spectrum before starting the curve fit of the next signal. In various embodiments, this method includes curve fitting signals in random order and in descending order by estimating the estimated power of each candidate signal.

The method of this invention can be implemented on various hardware devices. For example, the method can be implemented on any suitable digital signal processing platform. Suitable platforms include a general purpose processor or computer, a digital signal processing ("DSP") chip or device, a field programmable gate array (FPGA), or an application specific integrated circuit (ASIC).

Figure 4:
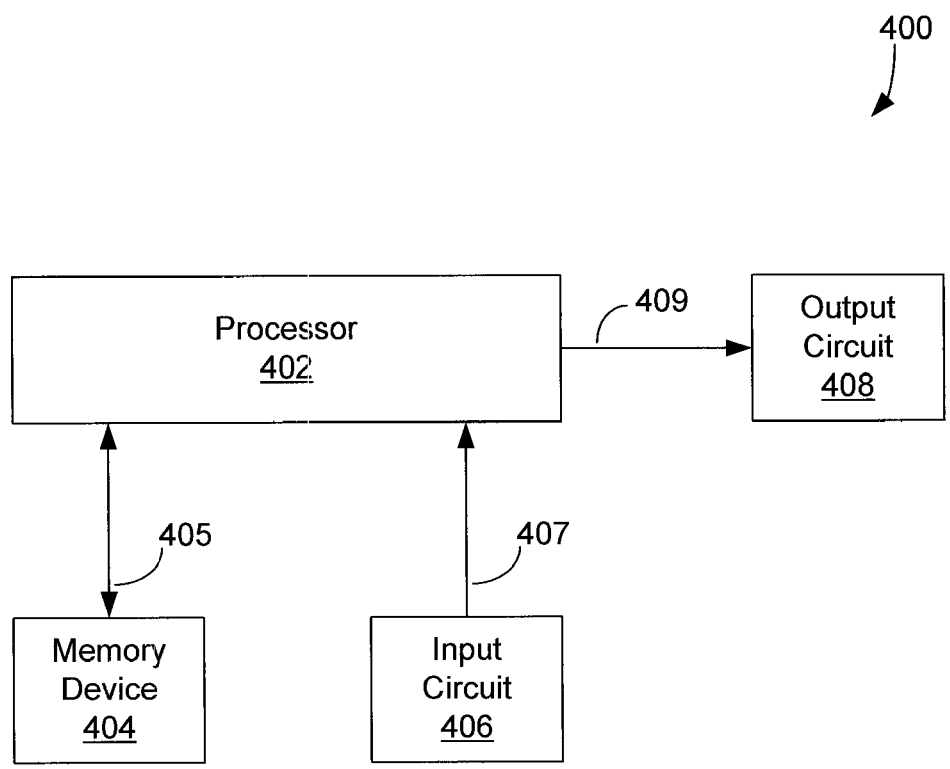
FIG. 4 depicts hardware for use with the signal parameter evaluator of FIG. 1.

FIG. 4 shows hardware implementing an embodiment of the invention 400. A hardware memory device 404, input circuit 406, and output circuit 408 are in signal communication 405, 407, 409 with a digital processor 402. The memory device stores the pulse shape library 352 and the processor carries out spectrum computations 101, 212, coarse evaluations 206, curve fitting 104, best shape selection 106 and miscellaneous operations and functions described herein and/or known to skilled artisans to provide a functional system.

While various embodiments of the present invention have been described above, it should be understood that they have been presented by way of example only, and not limitation. It will be apparent to those skilled in the art that various changes in the form and details can be made without departing from the spirit and scope of the invention. As such, the breadth and scope of the present invention should not be limited by the above-described exemplary embodiments, but should be defined only in accordance with the following claims and equivalents thereof.

What is claimed is:

1. A method of making a radio frequency receiver to receive a radio frequency signal from an unknown origin comprising the steps of:
    configuring the receiver for recognizing signals of unknown modulation, bandwidth and pulse shape, the receiver including one or more digital processors and a memory device for storing a pulse shape library;
    configuring one or more of the processors as a special purpose processor including a spectrum computation block, a curve fit block, and a best shape selector block;
    wherein the receiver acquires an input frequency spectrum including plural different radio frequency signals having respective different signal shapes and respective different shape equations;
    wherein signal recognition includes use of the special purpose processor to a) construct plural shape equation combinations from the shape equations, b) model the spectrum with plural shape equation combination curve fits, c) evaluate a goodness of fit metric for each curve fit, and, d) select the curve fit that best fits the input frequency spectrum as indicated by a goodness of fit metric;
    wherein the receiver intercepts or avoids the signal from the unknown origin based on the selected curve fit.

2. The method of claim 1 wherein the acquired spectrum includes digital samples corresponding to signal power at a range of frequencies.

3. The method of claim 2, further including the steps of:
    estimating how many candidate signals "n" are present in the spectrum;
    selecting a plurality of different shape equations intended to replicate signals in the spectrum; and,
    constructing a plurality of curve fits, each curve fit being a combination of "n" shape equations.

4. The method of claim 3, further including the step of:
    constructing the plurality of curve fits to represent each unique combination of shape equations.

5. The method of claim 1 further comprising at least two signals in the input spectrum that have the same shape but different modulation parameters.

6. A method of making a radio frequency receiver to receive a radio frequency signal from an unknown origin comprising the steps of:
    configuring the receiver for receiving signals of unknown modulation, bandwidth and pulse shape, the receiver including one or more digital processors and a memory device for storing a pulse shape library;

configuring one or more of the processors as a special purpose processor including a spectrum computation block, a curve fit block, and a best shape selector block;

wherein the receiver acquires an input frequency spectrum including a group of radio frequency signals;

wherein the receiver, without isolating individual signals, models the spectrum with a plurality of competing curve fits, determines a goodness of fit metric for each curve fit, and, selects the best fit from among the plurality of curve fits;

wherein modulation, carrier frequency, bandwidth and pulse shape is determined for the group of radio frequency signals such that the receiver intercepts or avoids the signal from the unknown origin.

7. The method of claim 6 wherein the group of arbitrary radio frequency signals includes overlapping signals.

8. The method of claim 6 further including the steps of:
estimating how many candidate signals "n" are present in the spectrum;
selecting a plurality of different shape equations intended to replicate signals in the spectrum; and,
constructing a plurality of curve fits, each curve fit being a combination of "n" shape equations.

9. The method of claim 8 wherein each shape equation is applicable to the same spectrum.

10. The method of claim 9, further including the step of constructing the plurality of curve fits to represent each unique combination of shape equations.

11. A method of making a radio frequency receiver to receive a radio frequency signal from an unknown origin comprising the steps of:
providing the radio frequency receiver for receiving signals of unknown modulation, bandwidth and pulse shape, the receiver including one or more digital processors and a memory device for storing a pulse shape library;
configuring one or more of the processors as a special purpose processor including a spectrum computation block, a coarse evaluation block, a curve fit block, and a best shape selector block;
including in the coarse evaluation block a coarse evaluation block spectrum computation block, a noise floor estimator, and a candidate identification block;
wherein the receiver a) coarsely evaluates an input frequency spectrum including plural signals, b) from the input spectrum coarse evaluation, identifies plural candidate signals of interest including signals of different shapes identified by respective ideal shape equations, c) constructs plural combination equations that are combinations of the shape equations, d) fits each of these combination equations to the input spectrum, and, e) determines the combination equation that best fits the input spectrum based on a selected goodness of fit metric;
wherein the receiver intercepts or avoids the signal of unknown origin based on the determined equation.

12. The method of claim 11 wherein each of the steps therein is performed automatically without human intervention.

13. The method of claim 11 further comprising at least two signals in the input spectrum that have the same shape but different modulation parameters.

14. A wireless communication system for characterizing arbitrary radio frequency emissions, the system comprising:
a radio receiver for receiving signals of unknown modulation, bandwidth, and pulse shape from plural transmitters;
the receiver including one or more digital processors and a memory device for storing a pulse shape library;
one or more of the processors configured as a special purpose processor including a spectrum computation block, a curve fit block, and a best shape selector block;
wherein the receiver acquires an input frequency spectrum including plural different signals having respective signal shapes and shape equations; and,
wherein signal recognition includes use of the special purpose processor to a) construct plural shape equation combinations from the shape equations, b) model the spectrum with plural shape equation combination curve fits, c) evaluate a goodness of fit metric for each curve fit, and d) select the curve fit that best fits the input frequency spectrum as indicated by a goodness of fit metric.

15. The device of claim 14 wherein the constructed shape equations do not correspond with any one of the shapes of the pulse shape library.

16. The device of claim 15 wherein the wherein the input frequency spectrum is acquired from multiple channels.

* * * * *